(12) United States Patent
Zhou et al.

(10) Patent No.: US 12,685,153 B2
(45) Date of Patent: Jul. 14, 2026

(54) SENSOR FOR THERMAL DISSIPATION MEASUREMENT

(71) Applicant: International Business Machines Corporation, Armonk, NY (US)

(72) Inventors: Huimei Zhou, Albany, NY (US); Oleg Gluschenkov, Tannersville, NY (US); Ruilong Xie, Niskayuna, NY (US); Xiaoming Yang, Clifton Park, NY (US); Jingyu Lian, Hopewell Junction, NY (US); Miaomiao Wang, Albany, NY (US); Haojun Zhang, Schenectady, NY (US); Huiming Bu, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 18/613,696

(22) Filed: Mar. 22, 2024

(65) Prior Publication Data

US 2025/0300033 A1      Sep. 25, 2025

(51) Int. Cl.
| | |
|---|---|
| *H10W 40/00* | (2026.01) |
| *G01K 17/00* | (2006.01) |
| *H10D 30/43* | (2025.01) |
| *H10D 30/67* | (2025.01) |
| *H10W 20/41* | (2026.01) |

(52) U.S. Cl.
CPC ............ *H10W 40/00* (2026.01); *G01K 17/00* (2013.01); *H10D 30/43* (2025.01); *H10D 30/6729* (2025.01); *H10W 20/427* (2026.01)

(58) Field of Classification Search
CPC . H10W 40/00; H10W 20/427; H10W 40/228; G01K 17/00; H10D 30/43; H10D 30/6729; H10D 30/0198; H10D 30/501
See application file for complete search history.

(56) References Cited

U.S. PATENT DOCUMENTS

| | | | |
|---|---|---|---|
| 9,299,641 | B2 | 3/2016 | Sekar et al. |
| 9,997,466 | B2 | 6/2018 | Vogt et al. |
| 11,038,092 | B2 | 6/2021 | Steinmann et al. |

(Continued)

FOREIGN PATENT DOCUMENTS

| | | |
|---|---|---|
| WO | 2022159141 A1 | 7/2022 |

OTHER PUBLICATIONS

Chang, C. W. et al., "Thermal Behavior of Self-heating Effect in FinFET Devices Acting on Back-end Interconnects", 2015 IEEE International Reliability Physics Symposium, Date of Conference: Apr. 19-23, 2015, 5 pages.

(Continued)

*Primary Examiner* — John E Breene
*Assistant Examiner* — Manuel Salvador Castellon, Jr.
(74) *Attorney, Agent, or Firm* — Scully, Scott, Murphy & Presser, P.C.; L. Jeffrey Kelly, Esq.

(57) ABSTRACT
A structure is provided that includes a thermal dissipation measurement sensor located on the frontside or the backside of a semiconductor device. The thermal dissipation measurement sensor includes a first probe region and a second probe region that are interconnected by a plurality of metal lines that are arranged in a serpentine pattern and having at least one non-powered metal line located between, and spaced apart from, each of the metal lines.

16 Claims, 6 Drawing Sheets

(56) References Cited

U.S. PATENT DOCUMENTS

| | | | |
|---|---|---|---|
| 11,195,818 B2 | 12/2021 | Chen et al. | |
| 2003/0206292 A1* | 11/2003 | Some | G01N 21/636 |
| | | | 356/237.1 |
| 2016/0355393 A1* | 12/2016 | Liu | B81B 3/0081 |
| 2020/0066713 A1* | 2/2020 | Hart | H10D 1/47 |
| 2022/0293540 A1 | 9/2022 | Chen et al. | |
| 2022/0359369 A1 | 11/2022 | Tsai et al. | |
| 2023/0178475 A1* | 6/2023 | He | H10P 72/74 |
| | | | 257/774 |
| 2024/0038605 A1* | 2/2024 | Chiu | H10P 74/273 |

OTHER PUBLICATIONS

Paliwoda, P., et al., "Self-heating characterization and its applications in technology development", 2020 IEEE 29th North Atlantic Test Workshop (NATW), Date of Conference: Jun. 17-24, 2020, 7 pages.

\* cited by examiner

SENSOR FOR THERMAL DISSIPATION MEASUREMENT

BACKGROUND

The present application relates to semiconductor technology, and more particularly to a sensor for measuring heat dissipation of a semiconductor device into a back-end-of-the-line (BEOL) structure or into a backside power distribution network.

Back-end-of-the-line (BEOL) refers to the multilayer interconnects that connect transistors to the outer bond-pads in semiconductor devices. BEOL structures consist of densely routed thin and narrow metal lines and vias surrounded by an interlayer dielectric (ILD) material. As technology nodes scale down, the thermal resistance of the BEOL structures increases due to smaller dimensions of metal lines and vias, as well as the lower thermal conductivity of low-permittivity dielectrics (often called low-k materials).

BEOL thermal analysis is an important aspect in the designing of BEOL structures. Some key points related to BEOL thermal analysis include (i) Understanding the thermal performance of the BEOL structure involves assessing its equivalent out-of-plane thermal conductivity; this parameter plays a crucial role in heat dissipation; (ii) Metal lines within the BEOL structure experience Joule heating due to electrical current flow; this heating effect impacts the overall thermal behavior; (iii) Various design parameters, material properties, and via layouts influence BEOL thermal performance; factors such as dielectric thermal conductivity, metal electrical resistivity, and barrier properties significantly affect the system; (iv) Comprehensive sensitivity analysis reveals that dielectric thermal conductivity strongly affects BEOL structure performance; additionally, metal electrical resistivity has a pronounced impact on Joule heating, and metal thermal conductivity and barrier electrical resistivity also contribute significantly; and (v) The density of vias (interconnects between metal layers) plays a critical role in BEOL structure thermal conductivity; changes in via density can lead to dramatic variations in heat dissipation.

In summary, BEOL thermal management is a complex interplay of material properties, design choices, and layout considerations. Also, BEOL design parameters and materials choices are crucial for efficient thermal dissipation in advanced semiconductor devices.

In recent years, power delivery to a semiconductor device has been made utilizing a backside power distribution network structure. It is also important to explore the thermal dissipation within the backside power distribution network structure for design technology co-optimization (DTCO) purposes and it is important in future technology development.

SUMMARY

A structure is provided that includes a thermal dissipation measurement sensor located on the frontside or the backside of a semiconductor device. The thermal dissipation measurement sensor includes a first probe region and a second probe region that are interconnected by a plurality of metal lines that are arranged in a serpentine pattern and having at least one non-powered metal line (i.e., a dummy metal line) located between, and spaced apart from, each of the metal lines.

In one aspect of the present application, a structure is provided that includes a semiconductor device having a frontside and a backside, and a thermal dissipation measurement sensor located on the frontside of the semiconductor device and including a first probe region and a second probe region that are interconnected by a plurality of frontside metal lines that are arranged in a serpentine pattern and having at least one non-powered frontside metal line located between, and spaced apart from, each of the frontside metal lines.

In another aspect of the present application, a structure is provided that includes a semiconductor device having a frontside and a backside, and a thermal dissipation measurement sensor located on the backside of the semiconductor device and including a first probe region and a second probe region that are interconnected by a plurality of backside metal lines that are arranged in a serpentine pattern and having at least one non-powered backside metal line located between, and spaced apart from, each of the backside metal lines.

DETAILED DESCRIPTION

Figures 1, 2:
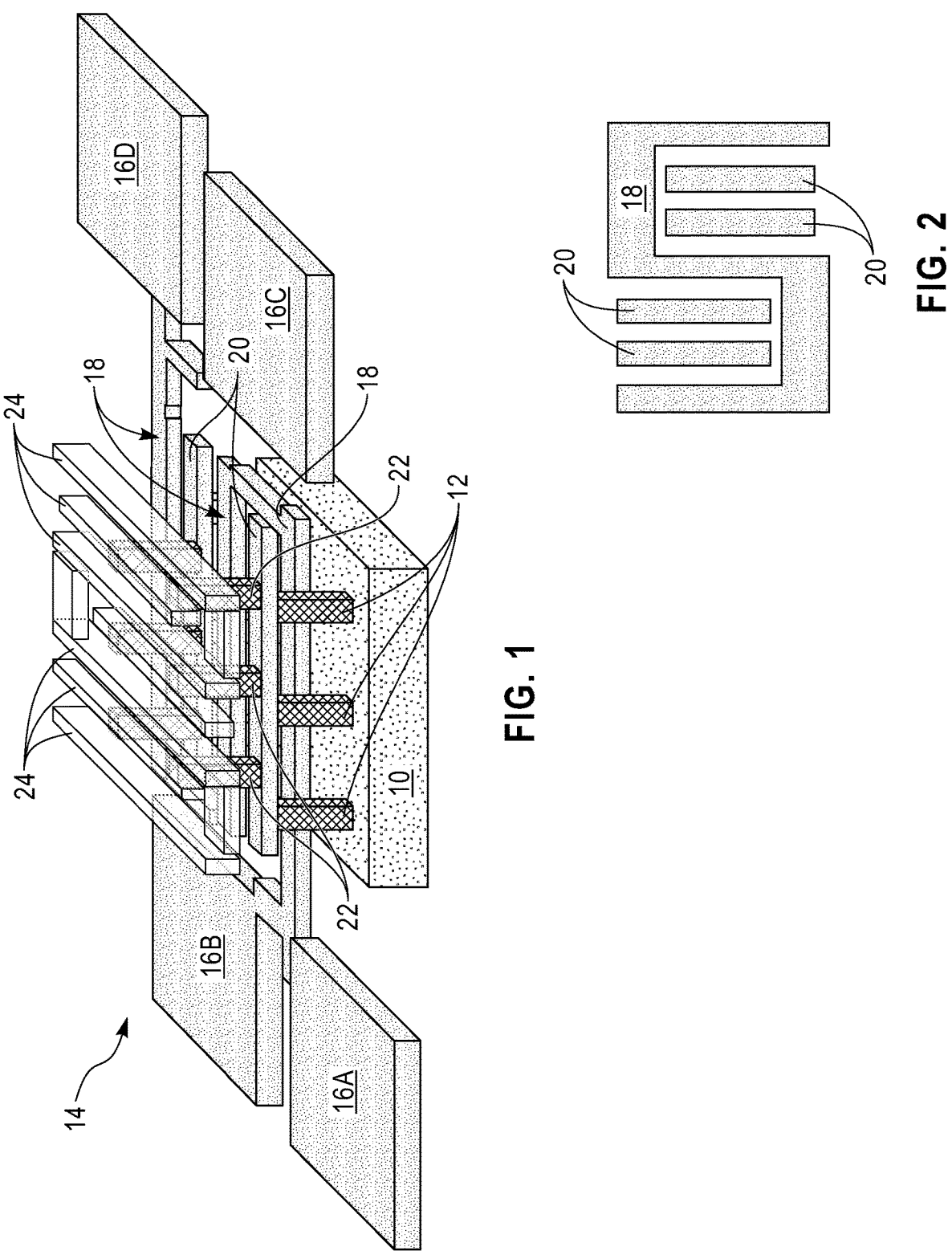
FIG. 1 is a three-dimensional (3D) overlook of a structure in accordance with the present application and including a thermal dissipation measurement sensor located on a frontside of a semiconductor device.
FIG. 2 is an enlarged view of the septime patterned portion of a thermal dissipation measurement sensor similar to the one illustrated in FIG. 1.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A structure is provided that includes a thermal dissipation measurement sensor located on the frontside or the backside of a semiconductor device. The thermal dissipation measurement sensor includes a first probe region and a second probe region that are interconnected by a plurality of metal lines that are arranged in a serpentine pattern and having at least one non-powered metal line located between, and spaced apart from, each of the metal lines. These and other aspects of the present application will now be described in greater detail.

Reference is first made to FIG. 1, which is a 3D overlook of a structure in accordance with the present application and including a thermal dissipation measurement sensor 14 located on a frontside of a semiconductor device 10. Throughout the present application, the term semiconductor device denotes an electronic component that relies on the electronic properties of a semiconductor material (such, as for example, silicon (Si), a silicon germanium (SiGe) alloy, a silicon germanium carbide (SiGeC) alloy, germanium (Ge), III/V compound semiconductors or II/VI compound semiconductors) for its function. The conductivity of the semiconductor device lies between conductors. In the present application, the semiconductor device 10 can be a single discrete semiconductor device, or the semiconductor device 10 can include two of more devices integrated on a same semiconductor substrate. In the present application, semiconductor devices including two or more devices integrated on a same semiconductor substrate can be referred to as an integrated circuit (IC) chip. In some embodiments, the semiconductor device 10 includes at least one transistor. A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In some embodiments, the transistor is a nanosheet transistor. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. Nanosheet transistors provide considerable scaling with high drive current capability. Nanosheet transistors provide a larger drive current for a given footprint compared to finFET technology. In other embodiments, the transistor can be a finFET, a nanowire FET, a planar FET, a fork sheet transistor, stacked FETs or any combination of such FETs including nanosheet transistors.

In the present application, the semiconductor device 10 includes a frontside and a backside. The frontside includes a side of the device that typically includes at least one transistor, frontside contact structures, and a frontside BEOL structure. The backside of the semiconductor device is the side of the device that is opposite the frontside. The backside typically includes backside contact structures and a backside power distribution network structure.

The semiconductor device 10 can composed of materials (semiconducting, conductive and insulating) that are well-known to those skilled in the art, and it can be formed utilizing front-end-of-the-line (FEOL) device processing steps that are well-known to those skilled in the art. So as not to obscure any aspect of the present application, the materials and processing techniques used in forming the semiconductor device 10 are not described in detail in this application.

In the embodiment illustrated in FIG. 1, thermal dissipation measurement sensor 14 is located on a frontside of the semiconductor device 10. Although not illustrated in the drawings, the thermal dissipation measurement sensor 14 is typically present in a frontside interlayer dielectric (ILD) layer. The frontside ILD layer is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted).

The thermal dissipation measurement sensor 14 is configured to measure heat dissipation from the semiconductor device 10 into the frontside BEOL structure. The heat can be generated from the conductive structures that are present in the semiconductor device 10. In the present application, the thermal dissipation measurement sensor 14 includes a first probe region and a second probe region that are interconnected by a plurality of frontside metal lines 18 that are arranged in a serpentine pattern and have at least one non-powered frontside metal line 20 located between, and spaced apart from, each of the frontside metal lines 18. In the present application, each of the first probe region and the second probe region includes a pair of metal probes. Notably, the first probe region includes first metal probe 16A and second metal probe 16B located on a first side of the serpentine patterned frontside metal lines 18, and the second probe region includes third metal probe 16C and fourth metal probe 16D located on a second side of the serpentine patterned frontside metal lines 18. In the present application, the first probe region is separated from the second probe region by at least the serpentine patterned frontside metal lines 18.

Figure 4:
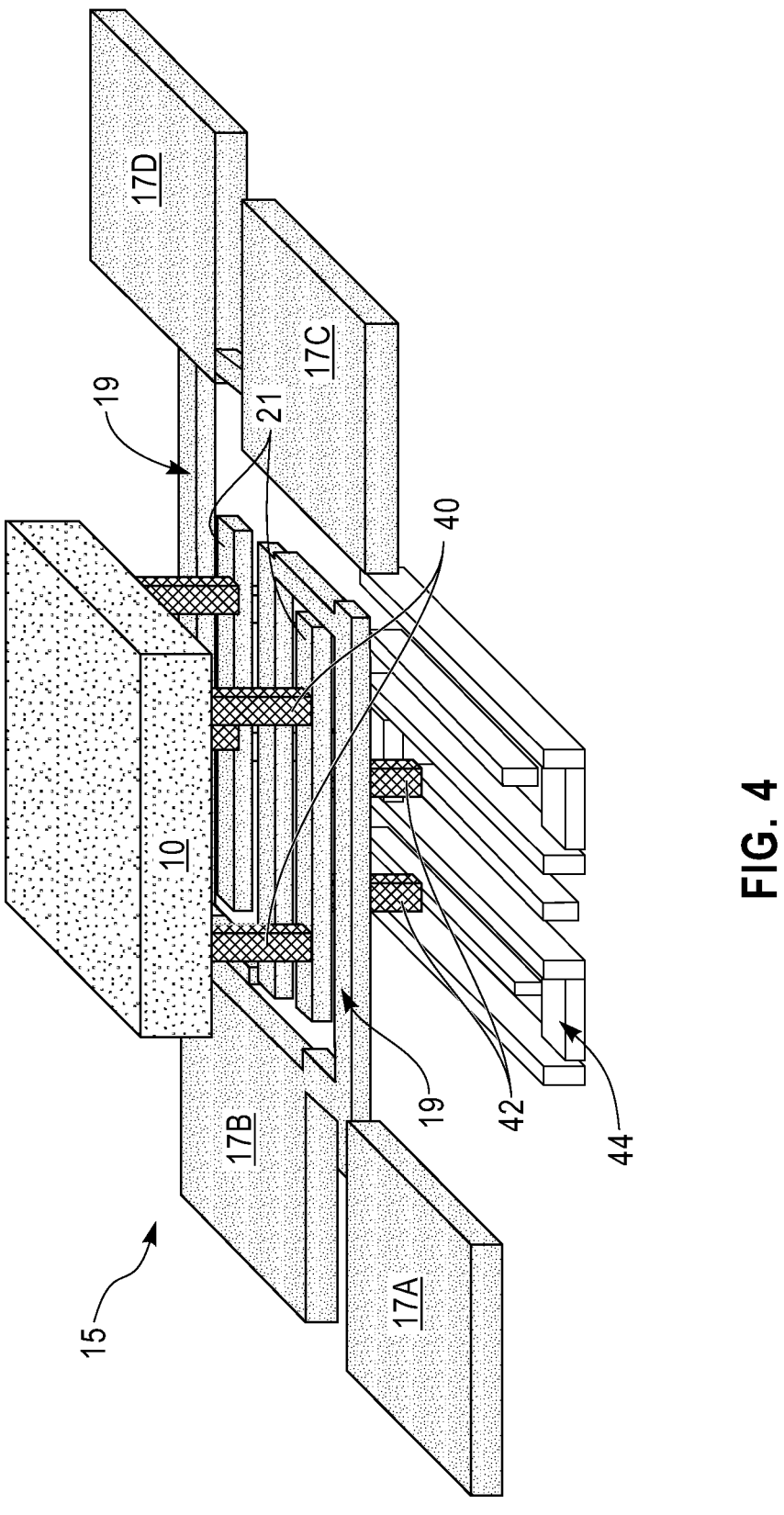
FIG. 4 is a three-dimensional (3D) overlook of a structure in accordance with the present application and including a thermal dissipation measurement sensor located on a backside of a semiconductor device.

In the present application, the term "serpentine pattern" is used to describe metal lines that are arranged in a curving (i.e., turns) and winding shape as is illustrated in FIGS. 1, 2 and 4. The number of curves (i.e., turns) within the serpentine pattern can vary. In the illustrated embodiment, two turns are shown. In the present application, the term "non-powered" frontside metal line 20 denotes a frontside metal line (i.e., a dummy metal line") that is not connected to any power source.

The various metal probes (i.e., first metal probe 16A, second metal probe 16B, third metal probe 16C and fourth metal probe 16D), the plurality of frontside metal lines 18, and the non-powered frontside metal lines 20 are composed of a metal such as, for example, copper (Cu), ruthenium (Ru), cobalt (Co), tungsten (W), aluminum (Al), ruthenium (Ru) or a work function metal (WFM). Illustrative WFMs that can be used in the present application, include, but are not limited to, titanium aluminum, titanium aluminum carbide, tantalum nitride, titanium nitride, hafnium nitride, hafnium silicon, tantalum carbide, or hafnium carbide. In embodiments of the present application, the various metal probes (i.e., first metal probe 16A, second metal probe 16B, third metal probe 16C and fourth metal probe 16D) and the plurality of frontside metal lines 18 are typically composed of same metal, while the non-powered frontside metal lines 20 can be composed of a compositionally same metal as, or a compositionally different metal than, the metal that provides the various metal probes (i.e., first metal probe 16A, second metal probe 16B, third metal probe 16C and fourth metal probe 16D) and the plurality of frontside metal lines 18.

In some embodiments of present application, the thermal dissipation measurement sensor 14 including the various metal probes (i.e., first metal probe 16A, second metal probe 16B, third metal probe 16C and fourth metal probe 16D), the plurality of frontside metal lines 18, and the non-powered frontside metal lines 20 can be formed by a damascene process in which a frontside ILD layer (not shown) is first deposited, and thereafter various openings are formed in the frontside ILD layer, and thereafter, the openings are filled with one of the metals mentioned above. The depositing of the frontside ILD layer can include chemical vapor deposition (CVD), plasma enhanced chemical vapor deposition (PECVD) or spin-on coating, The openings can be formed by lithography and etching, and the filling of the openings can include deposition of one or the metals mentioned above, followed by a planarization process such as, for example, chemical mechanical polishing (CMP). The deposition of one of the metals can include, for example, CVD, PECVD, sputtering, evaporation, or atomic layer deposition (ALD).

In other embodiments of present application, the thermal dissipation measurement sensor 14 including the various metal probes (i.e., first metal probe 16A, second metal probe 16B, third metal probe 16C and fourth metal probe 16D), the plurality of frontside metal lines 18, and the non-powered frontside metal lines 20 can be formed by a subtractive process in which a blanket layer of one of the above metals is first deposited, and then the blanket deposited metal layer is patterned to include the various metal probes (i.e., first metal probe 16A, second metal probe 16B, third metal probe 16C and fourth metal probe 16D), the plurality of frontside metal lines 18, and the non-powered frontside metal lines 20 by lithography and etching. The frontside ILD layer is then formed after the subtractive process mentioned above.

The number of non-powered frontside metal lines 20 that are located between each of the frontside metal lines 18 can vary. In FIG. 1, a single non-powered frontside metal line 20 is located between each of the frontside metal lines 18. FIG. 2 illustrates an embodiment in which a plurality of spaced apart non-powered frontside metal lines 20 are present between each frontside metal line 18. Notably, FIG. 2 shows two spaced apart non-powered frontside metal lines 20 present between each of the frontside metal lines 18. Embodiments including a plurality of spaced apart non-powered frontside metal lines 20 can be used for cases in which the semiconductor device 10 has metal structures with different metal densities.

In some embodiments of the present application, and as is illustrated in FIG. 1, a first frontside metal via 12 is present that connects the least one least non-powered metal line 20 to the semiconductor device 10. The first frontside metal via 12 can aid in increased thermal dissipation, while not impacting the functionality of the thermal dissipation measurement sensor 14 of the present application. The first frontside metal via 12 is present between the semiconductor device 10 and the non-powered frontside metal line 20 of the thermal dissipation measurement sensor 14 of the present application. Although not illustrated, the first frontside metal via 12 is embedded in another ILD layer. The first frontside metal via 12 can include any electrically conductive metal or electrically conductive metal alloy such as, for example, Cu, W, Al or a Cu—Al alloy. The first frontside metal via 12 can be formed by a damascene process or a subtractive process as described above. The number of first frontside metal vias 12 contacting each non-powered metal line 20 can vary and is not limited to the number illustrated in the drawing.

In some embodiments of the present application, and as is illustrated in FIG. 1, a second frontside metal via 22 is present that connects the least one least non-powered metal line 20 to interconnect metal lines 24 of a frontside BEOL structure. The second frontside metal via 22 can aid in increased thermal dissipation, while not impacting the functionality of the thermal dissipation measurement sensor 14 of the present application. The second frontside metal via 22 is present between the non-powered frontside metal line 20 of the thermal dissipation measurement sensor 14 of the present application and the frontside BEOL structure. Although not illustrated, the second frontside metal via 22 is embedded in another ILD layer. The second frontside metal via 22 can include any electrically conductive metal or electrically conductive metal alloy such as, for example, Cu, W, Al or a Cu—Al alloy. The second frontside metal via 22 can be formed by a damascene process or a subtractive process as described above. The number of second frontside metal vias 22 contacting the frontside BEOL structure can vary and is not limited to the number illustrated in the drawing. In some embodiments, which is the embodiment illustrated in FIG. 1, both the first frontside metal via 12 and the second frontside metal via 22 are present.

Figure 3:
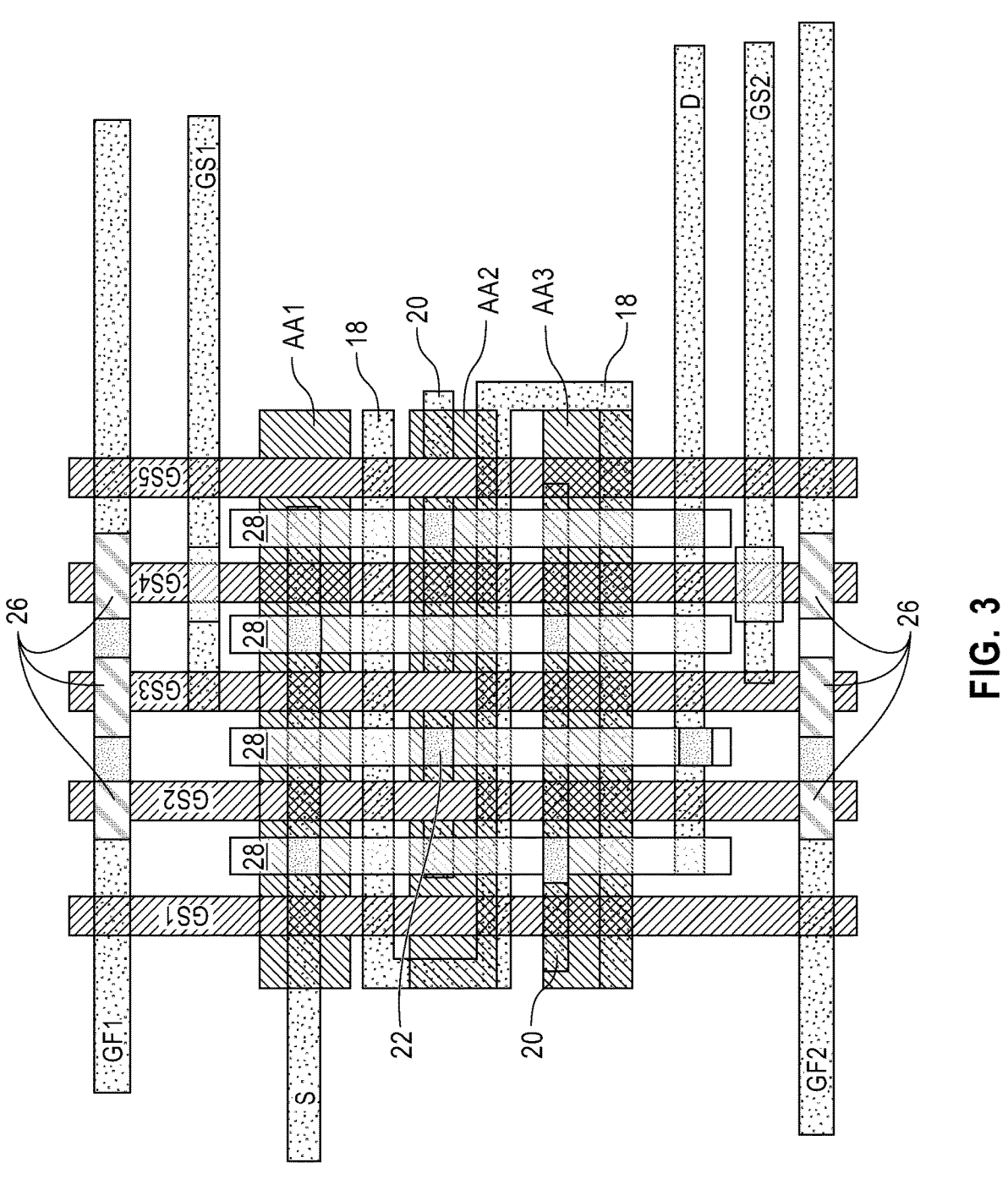
FIG. 3 is a top down view of a structure in accordance with the present application and including a gate sensor and a thermal dissipation measurement sensor located on a frontside of a semiconductor device.

Referring now to FIG. 3, there is illustrated a top down view of a structure in accordance with the present application and including a gate sensor and a thermal dissipation measurement sensor 14 located on a frontside of a semiconductor device. In the drawing, the frontside metal lines 18, and the non-powered frontside metal lines 20 of the thermal dissipation measurement sensor 14 are shown; the various metal probes (i.e., first metal probe 16A, second metal probe 16B, third metal probe 16C and fourth metal probe 16D) of the thermal dissipation measurement sensor 14 are not shown for clarity. The thermal dissipation measurement sensor 14 is configured to measure heat dissipation from each of the gate structures.

Notably, FIG. 3 includes a plurality of spaced apart gate structure, e.g., GS1, GS2, GS3, G4 and G4 that lie parallel to each other. Each gate structure includes a gate dielectric material and a gate electrode (both of which are known to those skilled in the art). Each of the gate structures lies perpendicular to, and passes through, three active areas, AA1, AA2 and AA3. The number of gate structures and active areas is not limited to the number illustrated in FIG. 3. The top down view also shows frontside gate contact structures 26 and frontside source/drain contact structures 28. The frontside gate contact structures 26 and the frontside source/drain contact structure 28 are composed of a contact conductor material such as, for example, W, Cu, Al, Co, Ru, Mo, Os, Ir, Rh, or an alloy thereof. In embodiments, frontside gate contact structures 26 and the frontside source/drain contact structures 28 can also include a silicide liner such as TiSi, NiSi, NiPtSi, etc., and an adhesion metal liner, such as Ti, Ta, TiN, TiN or any combination thereof. The frontside gate contact structures 26 and the frontside source/drain contact structures 28 are formed in a ILD layer utilizing a metallization process that is well-known to those skilled in the art. As is shown in FIG. 3, the frontside gate contact structures 26 can be electrically connected to one of the non-powered frontside metal lines 20 by means on the second frontside metal via 22.

The gate sensor includes gate force regions, e.g., GF1 and GF2, gate sense regions, e.g., GS1 and GS2, source sensor S and drain sensor D. Each of the gate sensor elements runs perpendicular to the gate structures and are present in the front-end-of-the-line (FEOL) level of the structure and could be measured temperature by kelvin gate sensor. In the present application, GF1, GF2, GS1 and GS2 are used as a typical gate sensor for thermal dissipation at the gate level. The gate, source and drain are wiring out with via connections for functionality of the arrays. The thermal dissipation measurement sensor 14 was located on arrays without impact the functionality of the arrays.

Reference is now made to FIG. 4, there is illustrated a 3D overlook of a structure in accordance with the present application and including a thermal dissipation measurement sensor 15 located on a backside of a semiconductor device 10. Thermal dissipation measurement sensor 15 can also be referred to a backside thermal dissipation measurement sensor to distinguish it from thermal dissipation measurement sensor 14 which is a frontside thermal dissipation measurement sensor. In the embodiment illustrated in FIG. 4, thermal dissipation measurement sensor 15 is located on a backside of the semiconductor device 10. Although not illustrated in FIG. 4, the thermal dissipation measurement sensor 15 is typically present in a backside ILD layer. The backside ILD layer is composed of one of the dielectric materials mentioned above for the frontside ILD layer. In this embodiment, the thermal dissipation measurement sensor 15 is configured to measure heat dissipation from the semiconductor device 10 into a backside power distribution network. The thermal dissipation measurement sensor 15 includes a first probe region and a second probe region that are interconnected by a plurality of backside metal lines 19 that are arranged in a serpentine pattern, as defined above and have at least one non-powered backside metal line 21 located between, and spaced apart from, each of the backside metal lines 19. In the present application, each of the first probe region and the second probe region includes a pair of metal probes. Notably, the first probe region includes first metal probe 17A and second metal probe 17B located on a first side of the serpentine patterned backside metal lines 19, and the second probe region includes third metal probe 17C and fourth metal probe 17D located on a second side of the serpentine patterned backside metal lines 19. In the present application, the term "non-powered" backside metal line 19 denotes a backside metal line (i.e., dummy metal line) that is not connected to any power source.

The various metal probes (i.e., first metal probe 17A, second metal probe 17B, third metal probe 17C and fourth metal probe 17D), the plurality of backside metal lines 19, and the non-powered frontside metal lines 19 are composed of a metal such as, for example, copper (Cu), ruthenium (Ru), cobalt (Co). tungsten (W), aluminum (Al), ruthenium (Ru) or a WFM, as previously described above. In embodiments of the present application, the various metal probes (i.e., first metal probe 17A, second metal probe 17B, third metal probe 17C and fourth metal probe 17D) and the plurality of backside metal lines 19 are typically composed of same metal, while the non-powered backside metal lines 21 can be composed of a compositionally same metal as, or a compositionally different metal than, the metal that provides the various metal probes (i.e., first metal probe 17A, second metal probe 17B, third metal probe 17C and fourth metal probe 17D) and the plurality of backside metal lines 21.

The thermal dissipation measurement sensor 15 of this embodiment can be formed utilizing one of the techniques mentioned above for forming the thermal dissipation measurement sensor 14. The number of non-powered backside metal lines 21 that are located between each of the backside metal lines 19 can vary. In FIG. 4, a single non-powered backside metal line 21 is located between each of the backside metal lines 19. In other embodiments, similar to that described in FIG. 2 above, a plurality of spaced apart non-powered backside metal lines 21 can be present between each backside metal line 19. Embodiments including a plurality of spaced apart non-powered backside metal lines 21 can be used for cases in which the semiconductor device 10 has metal structures with different metal densities.

In some embodiments and as is illustrated in FIG. 4, a first backside metal via 40 is present that connects a first side of the least non-powered backside metal line 21 to the semiconductor device 10. In some embodiments, and as is illustrated in FIG. 4, a second backside metal via 42 connecting a second side of the least one non-powered backside metal line 21 to a backside power distribution network; in the drawing the a second backside metal via 42 is connected to power lines 44 that are present in the backside power distribution network. In some embodiments, the first backside metal via 40 is present, but not the second backside metal via 42. In some embodiments, the second backside metal via 42 is present, but not the first backside metal via 40. The first backside metal via 40 and the second backside metal via 42 are composed of an electrically conductive metal or metal alloy and they can be formed utilizing a damascene or substrative process as described above for the first frontside metal via 12 and the second frontside metal via 22. The first backside metal via 40 and the second backside metal via 42 are embedded in separate backside ILD layers.

Figure 5:
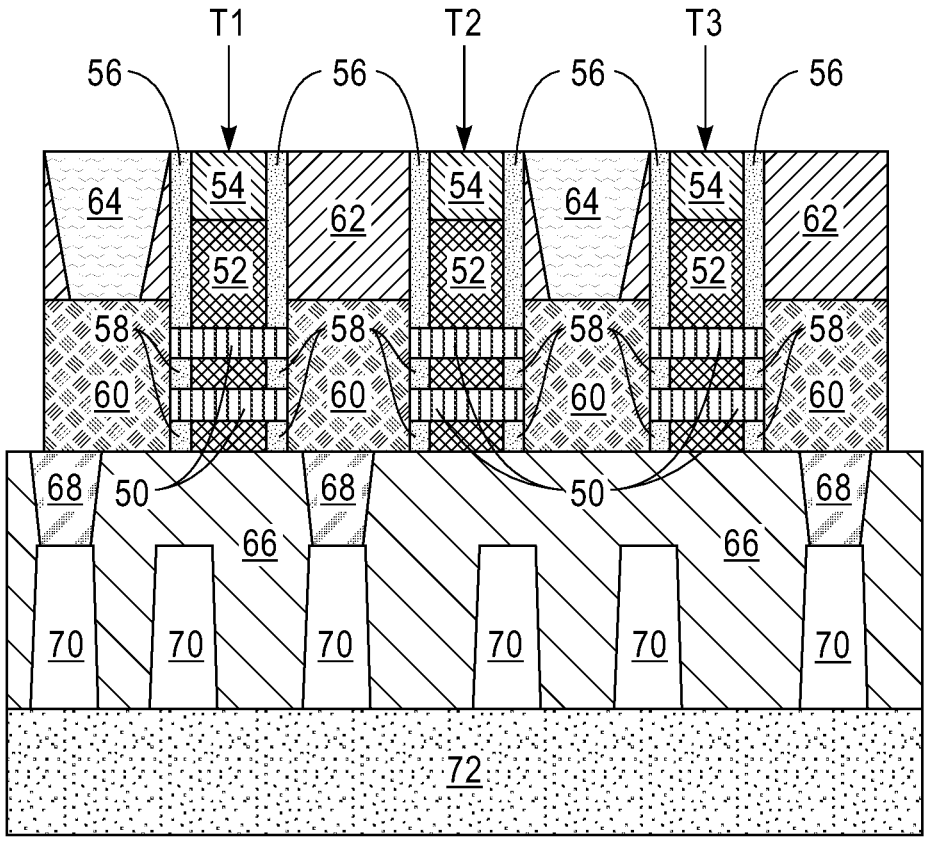
FIG. 5 is a cross sectional view of a backside of a semiconductor device including a backside power distribution network.

Reference is now made to FIG. 5, there is illustrated a backside of a semiconductor device including a backside power distribution network 72. The semiconductor device includes a plurality of nanosheet transistors, e.g., T1, T2, and T3, including a nanosheet stack of vertically stacked and spaced apart semiconductor channel material nanosheets 50, and a gate structure 52 wrapped around a middle portion of each of the vertically stacked and spaced apart semiconductor channel material nanosheets 50. A source/drain region 60 is located on each side of the gate structure 52 and extends outward from a sidewall surface of each of the vertically stacked and spaced apart semiconductor channel material nanosheets 50. Although the present application describes and illustrates nanosheet transistors, the present application is not limited to nanosheet transistors. Other transistors such as, for example, planar transistors, finFETs, semiconductor nanowire transistors, and/or fork sheet transistors can be used. The present application contemplates non-stacked transistors or transistors that are stacked one on top the other. Also present in FIG. 5 are a dielectric gate cap 54 present on top of the gate structure 52, gate spacers 56, inner spacer 58, frontside ILD layer 62, and source/drain contact structures 64. Each of these frontside elements are well-known to those skilled in the art and are composed of well-known materials, and can be formed utilizing techniques well-known to those skilled in the art. Notably, the dielectric gate cap 54 is composed of a dielectric hard mask material (such as, for example, silicon dioxide), the gate spacers 56 and the inner spacer 58 are composed of a spacer dielectric material, the source/drain contact structures 64 are composed of at least a contact conductor material, and the frontside ILD layer 62 is composed of one or more ILD materials.

The semiconductor device illustrated in FIG. 5 also includes a backside that includes backside ILD layer 66 having backside power wires 70 and backside placeholder material structure 68 embedded therein, and backside power distribution network 72. Each of these backside elements are well-known to those skilled in the art and are composed of well-known materials, and can be formed utilizing techniques well-known to those skilled in the art. Notably, the backside power wires 70 can be composed of electrically conductive metal or an electrically conductive metal alloy, the backside placeholder material structure 68 can be composed of a semiconductor material, and the backside ILD layer can be composed of one or more ILD materials.

In the embodiment illustrated in FIG. 5, one of the backside power wires 70 (see, for example, the third backside power wire from the left hand side of FIG. 5) electrically connects the backside power distribution network 72 to a backside placeholder material structure 68 that is in contact with source/drain region 60 of a transistor of the semiconductor device, and at least two other backside power wires 70 (see, for example, the fourth and fifth backside power wire 70 from the left hand side of FIG. 5) are in electrical contact with the backside power distribution network 72. Backside power wires 70 connected with backside placeholder material structure 68 is used as a power rail connect with backside power distribution network 72 for functionality of the array, non-connected backside power wire 70 is specially designed backside sensor include dummy metals to connect with deep backside power distribution network metal levels by the dummy metal vias.

As is further illustrated in FIG. 5, one of the backside power wires (see, for example, the backside power wire 70 located on the far left and side of FIG. 5) electrically connects the backside power distribution network 72 to a backside placeholder material structure 68 that is in contact with a source/drain region 60 of a transistor of the semiconductor device, wherein the source/drain region is further in contact with frontside source/drain contact structure 64. Thermal dissipation starts when the power to the arrays is switched on, and Kelvin measurement is performed on thermal dissipation measurement sensor 15.

Figure 6:
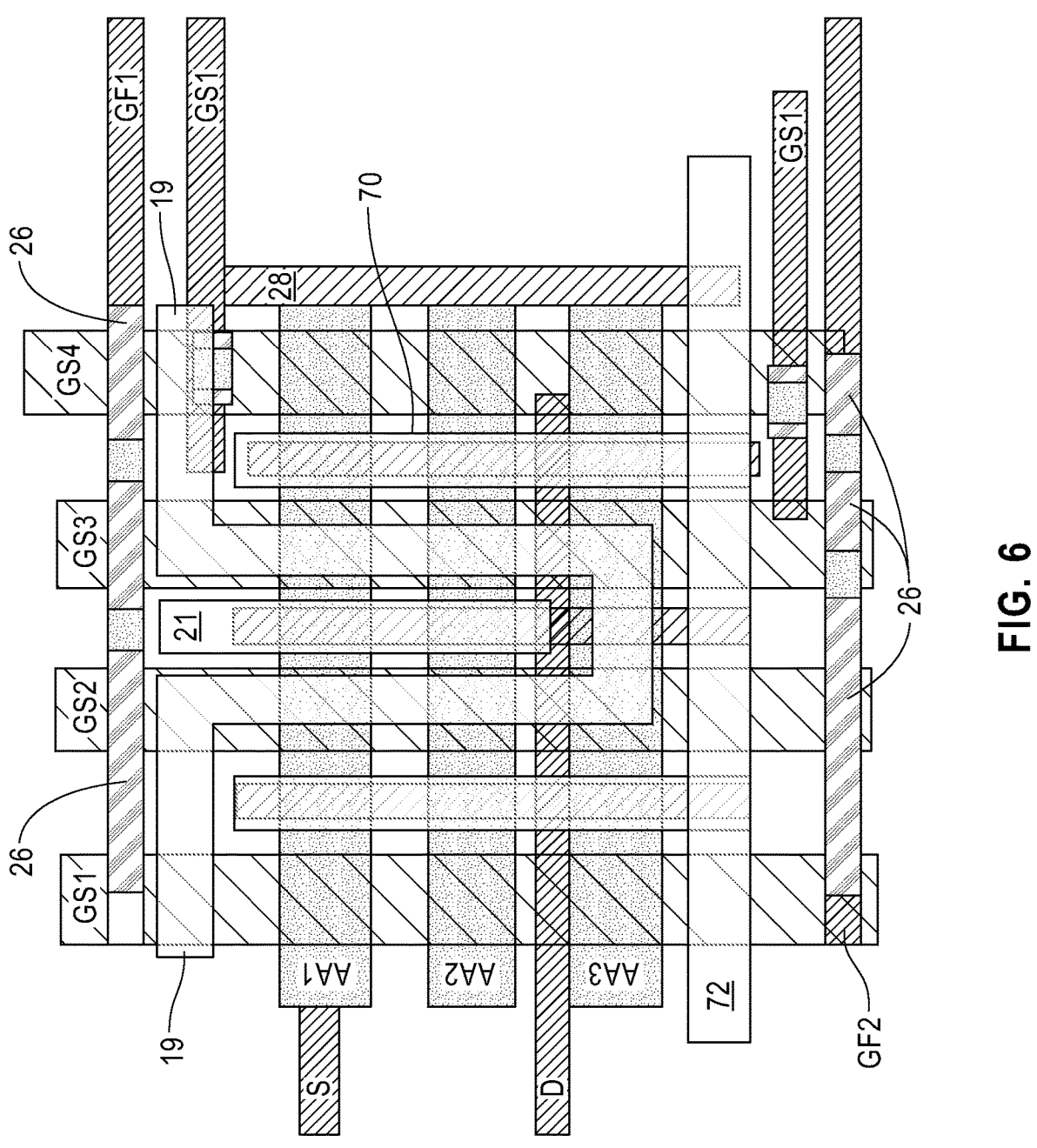
FIG. 6 is a top down view of a structure in accordance with the present application and including a gate sensor and a thermal dissipation measurement sensor located on a backside of a semiconductor device.
Figure 7:
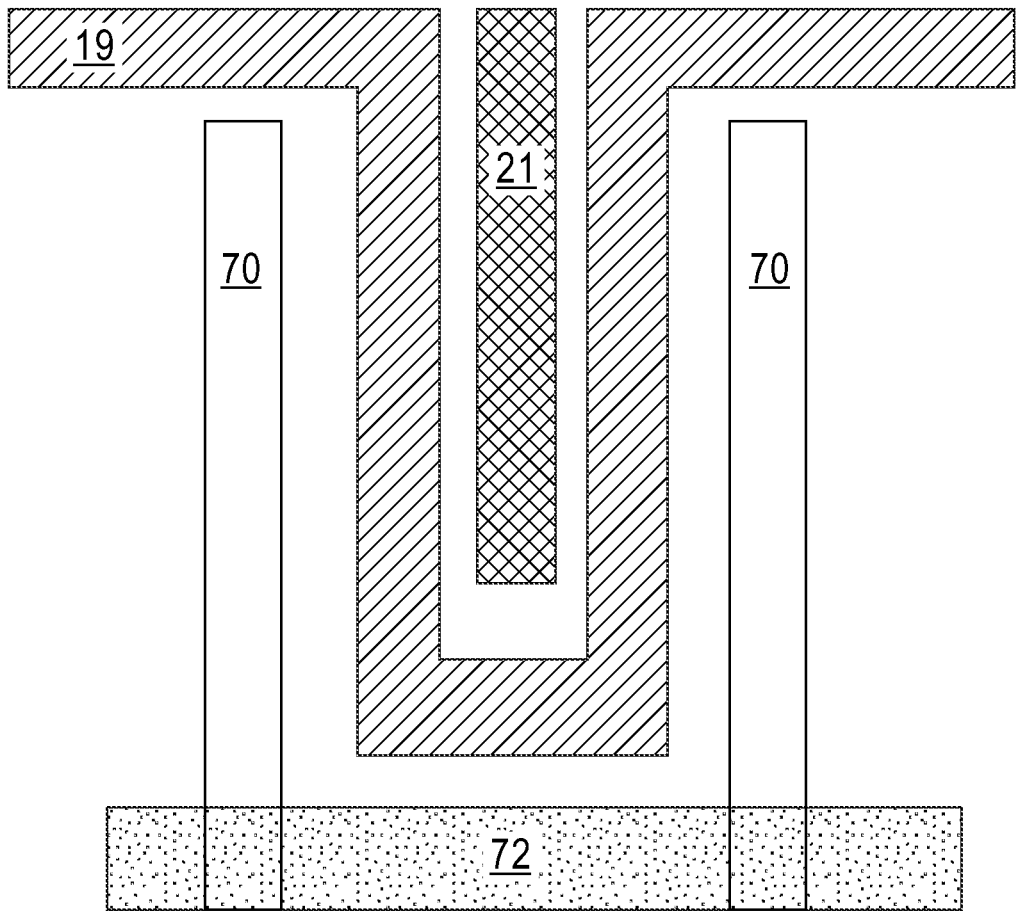
FIG. 7 is simplistic top down view of the structure shown in FIG. 6 highlighting the thermal dissipation measurement sensor and backside power wires.

Reference is now made to FIG. 6, there is illustrated a structure in accordance with the present application and including a gate sensor and a thermal dissipation measurement sensor 15 located on a backside of a semiconductor device such as is illustrated in FIG. 5. GF1, GF2, GS1 and GS2 are used as a typical gate sensor for thermal dissipation at the gate level. The gate, source and drain are wiring out with via connections or backside contacts for functionality of the arrays. Thermal dissipation measurement sensor 15 is located on backside of arrays with dummy metal without impact the functionality of the arrays. In the drawing, the backside metal lines 19, and the non-powered backside metal lines 21 of the thermal dissipation measurement sensor 15 are shown; the various metal probes (i.e., first metal probe 17A, second metal probe 17B, third metal probe 17C and fourth metal probe 17D) of the thermal dissipation measurement sensor 15 are not shown for clarity. The thermal dissipation measurement sensor 15 is configured to measure heat dissipation from each of the gate structures. Notably, FIG. 6 includes a plurality of spaced apart gate structure, e.g., GS1, GS2, GS, and G4 that lie parallel to each other. Each gate structure includes a gate dielectric material and a gate electrode (both of which are known to those skilled in the art). Each of the gate structures lies perpendicular to, and passes through, three active areas, AA1, AA2 and AA3. The number of gate structures and active areas is not limited to the number illustrated in FIG. 6. The top down view also shows frontside gate contact structures 26 and frontside source/drain contact structures 28. The frontside gate contact structures 26 and the frontside source/drain contact structure 28 are composed of a contact conductor material as defined above. Also present in the structure shown in FIG. 6 is a backside power wire 70. In this embodiment, the thermal dissipation measurement sensor 15 is located between two adjacent backside power wires 70 that are in electrical contact with at least the backside power distribution network 72; this aspect of the present application is more clearly illustrated in FIG. 7.

The gate sensor includes gate force regions, e.g., GF1 and GF2, gate sense regions, e.g., GS1 and GS2, source sensor S and drain sensor D. Each of the gate sensor elements runs perpendicular to the gate structures and are present at the front-end-of-the-line (FEOL) level of the structure, and could be measured temperature by kelvin gate sensor.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a semiconductor device having a frontside and a backside; and
   a thermal dissipation measurement sensor located on the frontside of the semiconductor device and comprising a first probe region and a second probe region that are interconnected by a plurality of frontside metal lines that are arranged in a serpentine pattern and having at least one non-powered frontside metal line located between, and spaced apart from, each of the frontside metal lines.

2. The structure of claim 1, wherein each of the first probe region and the second probe region comprises a pair of metal probes.

3. The structure of claim 1, wherein the at least one non-powered frontside metal line comprises a plurality of spaced apart non-powered frontside metal lines.

4. The structure of claim 1, further comprising a first frontside metal via connecting the least one least non-powered metal line to the semiconductor device.

5. The structure of claim 4, wherein the first frontside metal via is in contact with a frontside source/drain contact structure.

6. The structure of claim 1, further comprising a second frontside metal via connecting the least one least non-powered metal line to a metal line present in an interconnect level of a frontside back-end-of-the-line (BEOL) structure.

7. The structure of claim 1, further comprising a first frontside metal via connecting the least one non-powered metal line to the semiconductor device, and a second frontside metal via connecting the least one non-powered metal line to a metal line present in a frontside BEOL structure.

8. The structure of claim 7, wherein the first frontside metal via is in contact with a frontside source/drain contact structure.

9. A structure comprising:

a semiconductor device having a frontside and a backside; and a thermal dissipation measurement sensor located on the backside of the semiconductor device and comprising a first probe region and a second probe region that are interconnected by a plurality of backside metal lines that are arranged in a serpentine pattern and having at least one non-powered backside metal line located between, and spaced apart from, each of the backside metal lines.

10. The structure of claim 9, wherein each of the first probe region and the second probe region comprises a pair of metal probes.

11. The structure of claim 9, wherein the at least one non-powered backside metal line comprises a plurality of spaced apart non-powered backside metal lines.

12. The structure of claim 9, further comprising a first backside metal via connecting a first side of the least non-powered backside metal line to the semiconductor device.

13. The structure of claim 12, further comprising a second backside metal via connecting a second side of the least one non-powered backside metal line to a backside power distribution network.

14. The structure of claim 9, further comprising a backside power wire electrically connecting a backside power distribution network to a backside placeholder material structure that is in contact with a source/drain region of a transistor of the semiconductor device and at least two other backside power wires in electrical contact with only the backside power distribution network structure.

15. The structure of claim 9, wherein the thermal dissipation measurement sensor is located between two adjacent backside power wires that are in electrical contact with at least a backside power distribution network.

16. The structure of claim 9, further comprising a backside power wire electrically connecting a backside power distribution network to a backside placeholder material structure that is in contact with a source/drain region of a transistor of the semiconductor device, wherein the source/drain region is further in contact with a frontside source/drain contact structure.

\* \* \* \* \*